(12) United States Patent
Young

(10) Patent No.: US 7,109,522 B2
(45) Date of Patent: Sep. 19, 2006

(54) ELECTROLUMINESCENT DISPLAY DEVICES

(75) Inventor: Nigel D. Young, Redhill (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/526,865

(22) PCT Filed: Aug. 22, 2003

(86) PCT No.: PCT/IB03/03818

§ 371 (c)(1),
(2), (4) Date: Mar. 4, 2005

(87) PCT Pub. No.: WO2004/023575

PCT Pub. Date: Mar. 18, 2004

(65) Prior Publication Data

US 2005/0258437 A1 Nov. 24, 2005

(30) Foreign Application Priority Data

Sep. 5, 2002 (GB) .................. 0220613.4

(51) Int. Cl.
H01L 27/15 (2006.01)
H01L 31/12 (2006.01)
H01L 33/00 (2006.01)

(52) U.S. Cl. ............................ 257/79; 257/82; 257/88
(58) Field of Classification Search .................. 257/79, 257/82, 88
See application file for complete search history.

Primary Examiner—Thien F. Tran

(57) ABSTRACT

In an active matrix electroluminescent display device having an array of pixels, a drive transistor and an electroluminescent display element in each pixel are connected in series between a power line for supplying or drawing a controllable current to or from the display element and a common potential line. The power line and the common potential line each comprise a sheet electrode shared among all pixels of the array. In this arrangement, sheet electrodes are used both for the current supply to the EL display element and the current sink. This reduces considerably the line resistance.

22 Claims, 4 Drawing Sheets

ELECTROLUMINESCENT DISPLAY DEVICES

This invention relates to electroluminescent display devices, particularly active matrix display devices having thin film switching transistors associated with each pixel.

Matrix display devices employing electroluminescent, light-emitting, display elements are well known. The display elements may comprise organic thin film electroluminescent elements, for example using polymer materials, or else light emitting diodes (LEDs) using traditional III-V semiconductor compounds. Recent developments in organic electroluminescent materials, particularly polymer materials, have demonstrated their ability to be used practically for video display devices. These materials typically comprise one or more layers of a semiconducting conjugated polymer sandwiched between a pair of electrodes, one of which is transparent and the other of which is of a material suitable for injecting holes or electrons into the polymer layer. The polymer material can be fabricated using a PVD process, or simply by a spin coating technique using a solution of a soluble conjugated polymer. Ink-jet printing may also be used. Organic electroluminescent materials exhibit diode-like I-V properties, so that they are capable of providing both a display function and a switching function, and can therefore be used in passive type displays. Alternatively, these materials may be used for active matrix display devices, with each pixel comprising a display element and a switching device for controlling the current through the display element.

Display devices of this type have current-addressed display elements, so that a conventional, analogue drive scheme involves supplying a controllable current to the display element. It is known to provide a current source transistor as part of the pixel configuration, with the gate voltage supplied to the current source transistor determining the current through the display element. A storage capacitor holds the gate voltage after the addressing phase.

FIG. 1 shows a known pixel circuit for an active matrix addressed electroluminescent display device. The display device comprises a panel having a row and column matrix array of regularly-spaced pixels, denoted by the blocks 1 and comprising electroluminescent display elements 2 together with associated switching means, located at the intersections between crossing sets of row (selection) and column (data) address conductors 4 and 6. Only a few pixels are shown in the Figure for simplicity. In practice there may be several hundred or more rows and columns of pixels. The pixels 1 are addressed via the sets of row and column address conductors by a peripheral drive circuit comprising a row, scanning, driver circuit 8 and a column, data, driver circuit 9 connected to the ends of the respective sets of conductors.

The electroluminescent display element 2 comprises an organic light emitting diode, represented here as a diode element (LED) and comprising a pair of electrodes between which one or more active layers of organic electroluminescent material is sandwiched. The display elements of the array are carried together with the associated active matrix circuitry on one side of an insulating support. Either the cathodes or the anodes of the display elements are formed of transparent conductive material. For downward emitting arrangements, the support is of transparent material such as glass and the electrodes of the display elements 2 closest to the substrate may consist of a transparent conductive material such as ITO so that light generated by the electroluminescent layer is transmitted through these electrodes and the support so as to be visible to a viewer at the other side of the support. Typically, the thickness of the organic electroluminescent material layer is between 100 nm and 200 nm. Typical examples of suitable organic electroluminescent materials which can be used for the elements 2 are known and described in EP-A-0 717446. Conjugated polymer materials as described in WO96/36959 can also be used.

For upward emitting arrangements, the substrate can be opaque or coloured.

FIG. 2 shows in simplified schematic form a known pixel and drive circuitry arrangement for providing voltage-addressed operation. Each pixel 1 comprises the EL display element 2 and associated driver circuitry. The driver circuitry has an address transistor 16 which is turned on by a row address pulse on the row conductor 4. When the address transistor 16 is turned on, a voltage on the column conductor 6 can pass to the remainder of the pixel. In particular, the address transistor 16 supplies the column conductor voltage to a current source 20, which comprises a drive transistor 22 and a storage capacitor 24. The column voltage is provided to the gate of the drive transistor 22, and the gate is held at this voltage by the storage capacitor 24 even after the row address pulse has ended. The drive transistor 22 draws a current from the power supply line 26.

The drive transistor 22 in this circuit is implemented as a PMOS TFT, so that the storage capacitor 24 holds the gate-source voltage fixed. This results in a fixed source-drain current through the transistor, which therefore provides the desired current source operation of the pixel.

The above basic pixel circuit is a voltage-addressed pixel, and there are also current-addressed pixels which sample a drive current. However, all pixel configurations require current to be supplied to each pixel.

In a conventional pixel configuration, the power supply line 26 is a row conductor, and is typically long and narrow. The displays are typically backward-emitting, through the substrate carrying the active matrix circuitry. This is the preferred arrangement because the desired cathode material of the EL display element is opaque, so that the emission is from the anode side of the EL diode. This desired cathode material is a metal of low work function, such as calcium or barium, for the ability to inject electrons with low applied voltages. These low work function metals are also reactive, so that it is not desirable to place them against the active matrix circuitry, as the required patterning is then difficult.

Metal row conductors are formed, and for backward emitting displays they need to occupy the space between display areas, as they are opaque. For example, in a 12.5 cm (diameter) display, which is suitable for portable products, the row conductor may be approximately 11 cm long and 20 µcm wide. For a typical metal sheet resistance of 0.2 Ω/square, this gives a line resistance for a metal row conductor of 1.1 kΩ. A bright pixel may draw around 8 µA, and the current drawn is distributed along the row. A row of 1920 pixels (640×3 colours) can experience a voltage drop of around 9 volts. This can be reduced by a factor of 4 by drawing current from both ends of the row, and further still by improvements in efficiency of the EL materials. Nevertheless significant voltage drops are still present. This problem is worsened for larger displays, even if the total line resistance can be kept the same. This is because there are more pixels per row, or alternatively larger pixels if the resolution is the same. The voltage variations along the power supply line alter the gate-source voltage on the drive transistors, and thereby affect the brightness of the display, in particular causing dimming in the center of the display (assuming the rows are sourced from both ends). Furthermore, as the currents drawn by the pixels in the row are image-dependent, it is difficult to correct the pixel drive levels by data correction techniques.

ITO is used to form the common electrode in conventional displays, and has a typical sheet resistance of 20 Ω/square. This increased sheet resistance makes ITO unsuitable for row conductors.

According to the invention, there is provided an active matrix electroluminescent display device comprising an array of display pixels, each pixel comprising:

an electroluminescent display element; and active matrix circuitry including a drive transistor for driving a current through the display element, wherein the drive transistor and the display element are connected in series between a power line for supplying or drawing a controllable current to or from the display element and a common potential line, and wherein the power line and the common potential line each comprise a sheet electrode shared between all pixels of the array.

In this arrangement, sheet electrodes are used both for the current supply to the EL display element and the current sink. The power supply line is thus a shared sheet electrode instead of the conventional row electrode. This reduces considerably the line resistance. For example, if the aspect ratio of the sheet electrode power line is 1:1 (square) the line resistance is simply equal to the resistance per square of the material, for example 0.2 Ω typically for metals. If the sheet is connected around the entire periphery, the line resistance is lower.

The device comprises a substrate, and the active matrix circuitry may overlie the substrate with an electroluminescent layer overlying the active matrix circuitry.

The display may be backward emitting through the substrate, so that conventional materials may be used in the manufacture of the device. The power line may then comprise a substantially transparent electrically conductive sheet (for example ITO) between the substrate and the active matrix circuitry. This provides a transparent layer, and the thickness can be selected to provide the desired resistance.

In this embodiment, an insulating layer is provided between the substantially transparent electrically conductive sheet and the active matrix circuitry, with contact portions provided through the insulating layer. This provides the contact from the power line (sheet) to each pixel.

The display may instead be upward emitting away from the substrate, and materials have been developed which enable the EL display element cathode to overlie the active matrix circuitry, with light output from the anode away from the substrate. In this case, the power line comprises a metal sheet between the substrate and the active matrix circuitry.

In this case, the common potential line needs to be transparent, and thus may comprise an ITO layer forming the anodes of the EL display elements, and overlying the electroluminescent layer.

In another example, the display may instead be upward emitting away from the substrate, and with emission through the cathode. Cathode designs have been implemented which combine the required electrical properties with suitable optical transparency. In this case, the cathodes can form the common potential line.

For example, the cathode may comprise a substantially optically transparent conducting layer of a first thickness, and a second layer of a second, smaller thickness, and which comprises a low work function metal.

In these examples, one of the common potential line and the power supply line needs to be transparent (as they are on opposite sides of the EL material layer), and this will normally result in the use of ITO. This has a high resistance and it would be preferable to provide metallic electrodes for both current carrying lines.

Therefore, in another example, a second metal layer is provided between the substrate and the active matrix layer, isolated from the first metal layer, and wherein the second metal layer is connected to the common potential line. In this way, the common potential line and the power supply line are connected to metal sheet layers.

The common potential line may comprise a substantially transparent electrically conductive layer (e.g. ITO) forming the anodes or cathodes of the EL display elements (in the latter case, a low work function metal is combined with the ITO layer), and overlying the electroluminescent layer, and the second metal layer contacts the common potential line with contact portions extending through the active matrix circuitry. These contact portions also extend through openings in the metal sheet.

The invention will now be described by way of example with reference to the accompanying drawings, in which.

Figure 1:
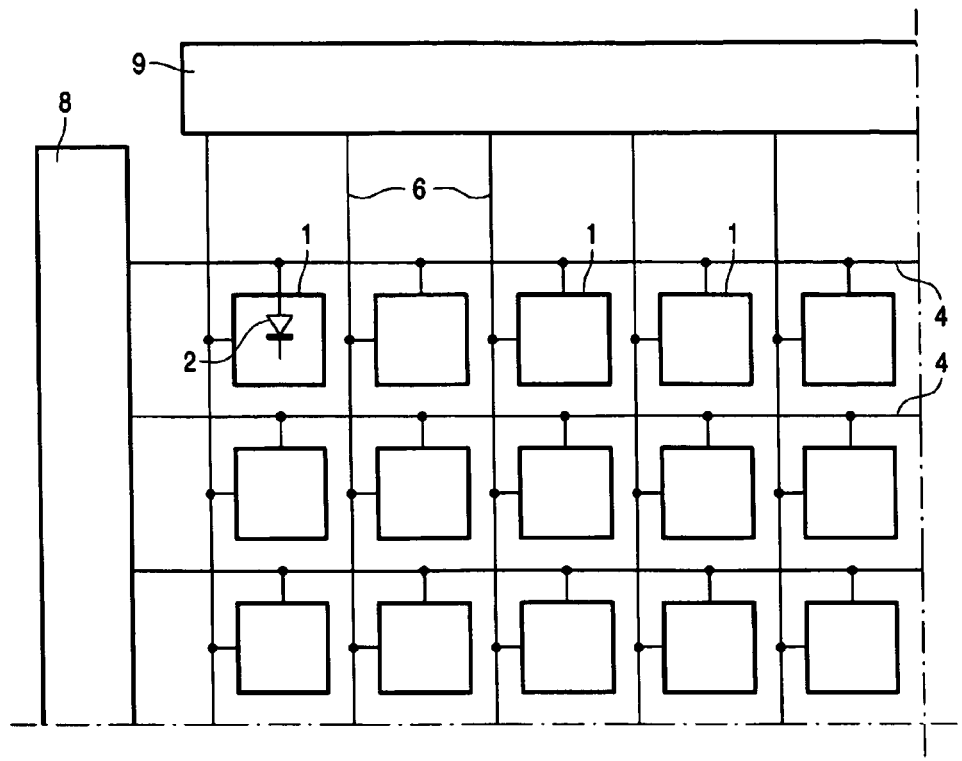
FIG. 1 shows a known EL display device.
Figure 2:
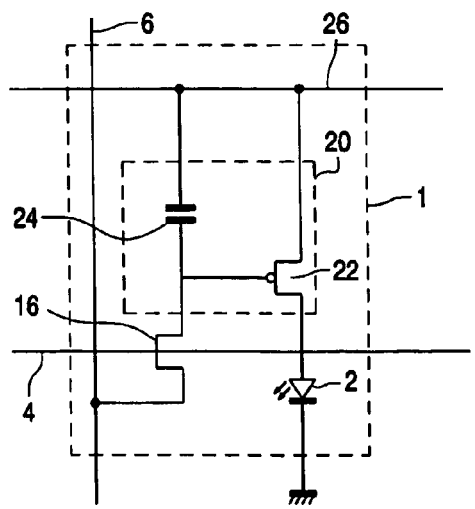
FIG. 2 is a simplified schematic diagram of a known pixel circuit for current-addressing the EL display pixel.

It should be noted that these figures are diagrammatic and not drawn to scale. Relative dimensions and proportions of parts of these figures have been shown exaggerated or reduced in size, for the sake of clarity and convenience in the drawings.

The invention provides a display in which the current is supplied and drained using substantially continuous sheets of conductive material. As shown schematically in FIG. 3, the power supply line 26 is a sheet electrode, and it is shared between all pixels of the display. The term "line" will continue to be used, although of course the conductor is a rectangular sheet. This power supply line is typically provided with a fixed voltage, for example 8 Volts.

Figure 3:
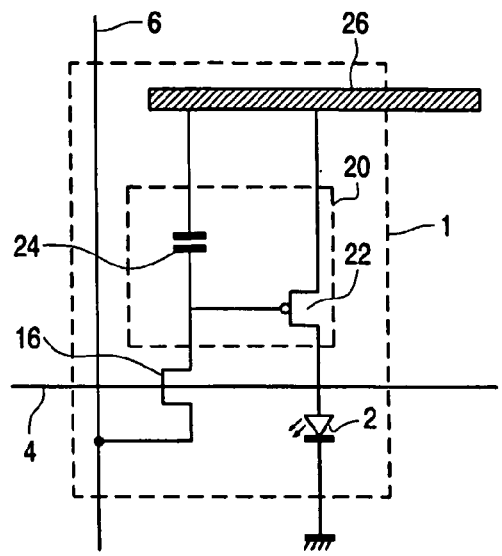
FIG. 3 shows a simplified schematic diagram of a pixel circuit of the invention.

The invention can be applied to any pixel design, not only the basic voltage-addressed pixel configuration of FIG. 3. Indeed, any pixel which draws current from a power line can be modified to take advantage of the invention. There are many other types of pixel configuration, for example including additional circuit elements for aging compensation or for threshold voltage compensation, and there are also numerous current-addressed pixel designs. These all require current to be provided to the display elements of the pixels and can thereby benefit from the invention. These pixels may use NMOS, PMOS or CMOS technologies.

Figure 4:
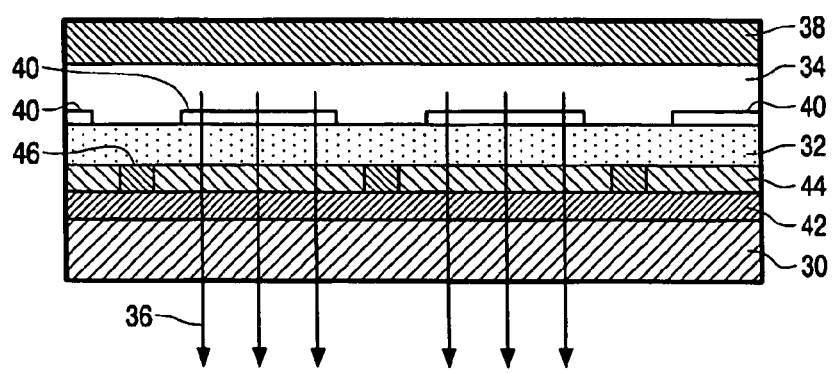
FIG. 4 shows a first example of display device according to the invention.

FIG. 4 shows a first example of display device according to the invention.

The device comprises a substrate 30, active matrix circuitry 32 and an electroluminescent (EL) layer 34 over the active matrix circuitry 32. The substrate is typically glass. The active matrix circuitry is shown schematically as it may take various forms, as discussed above. The display is backward emitting through the substrate as shown by arrows 36, and the common potential line (the earth connection in FIG. 3) is provided by a metal cathode layer 38 overlying the EL layer 34. The anodes of the individual pixels are defined by ITO pixel electrodes 40 which in practice form part of the active matrix circuitry 32.

The power supply line 26 is implemented as an ITO sheet 42 beneath the active matrix circuitry 32, in particular between the substrate 30 and the active matrix circuitry 32. This provides a transparent layer, and the thickness can be selected to provide the desired resistance. Furthermore, additional metal conductor portions may be provided outside the pixel areas to reduce the resistance further.

An insulating layer 44 is provided between the ITO sheet 42 and the active matrix circuitry, with contact portions 46 provided through the insulating layer 44. This provides the contact from the ITO power line to each pixel. The insulating layer can be any suitable transparent material, but is preferably silicon oxide or silicon nitride. The contact portions 46 are typically metallic contacts.

Figure 5:
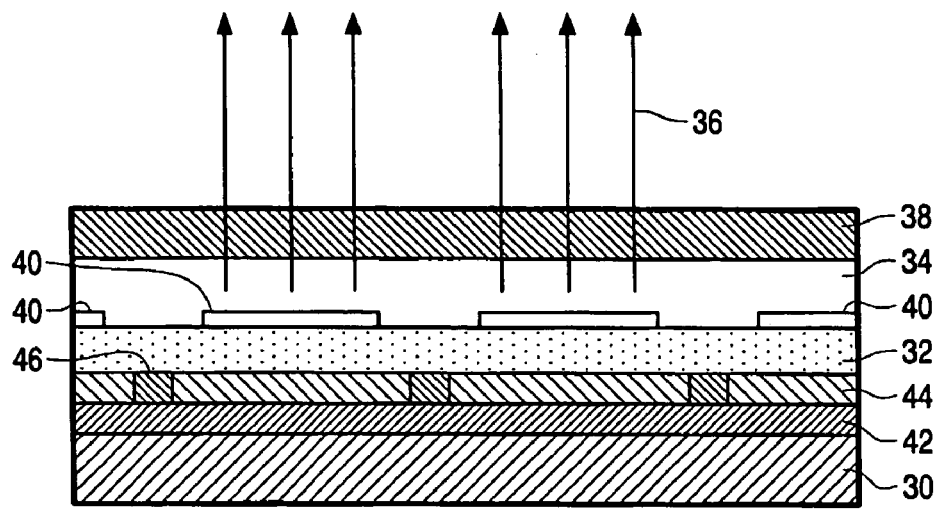
FIG. 5 shows a second example of display device according to the invention.

The display may instead be upward emitting away from the substrate, and materials have been developed which enable the EL display element cathode to overlie the active matrix circuitry despite the low work function metal within the cathode layer. In this case, the light output from the anode is away from the substrate. Upward emitting arrangements can be made with higher aperture and also do not suffer transmission loss through the supporting substrate. FIG. 5 shows an implementation of the invention for an upwardly emitting display. The same reference numerals are used as in FIG. 4 for the same components.

In this case, the common potential line 38 is a transparent ITO layer and forms the anodes of the EL display elements. In this case, the pixel electrodes 40 can be metallic. The power supply line is in this case implemented as a metallic sheet conductor 42, again with contact portions 46 through an insulating layer 44 making contact with the individual pixel circuits of the active matrix circuitry 32.

In these two examples, one of the common potential line 38 and the power supply line 42 needs to be transparent, as they are on opposite sides of the EL material layer 34. The use of ITO results still in a high resistance, even if the resistance is reduced by providing a metallic overlay outside the pixel areas. The sheet conductors, both the power supply line and the common potential line, have to carry the currents from all pixels, rather than from only a row of pixels. The benefit of the reduction in resistance can be considered to be W/S where W is the row line width and S is the row spacing. In other words, for each row, the row conductor width is effectively increased from the previous row width to the full spacing between adjacent rows. This ratio may typically be around 0.2. Therefore, a benefit is only obtained if the materials needed for the shared conductor have resistance no worse than 5 times the metal resistance previously used for the metal row conductors.

In practice the use of ITO limits the benefit of the examples of FIGS. 4 and 5.

Figure 6:
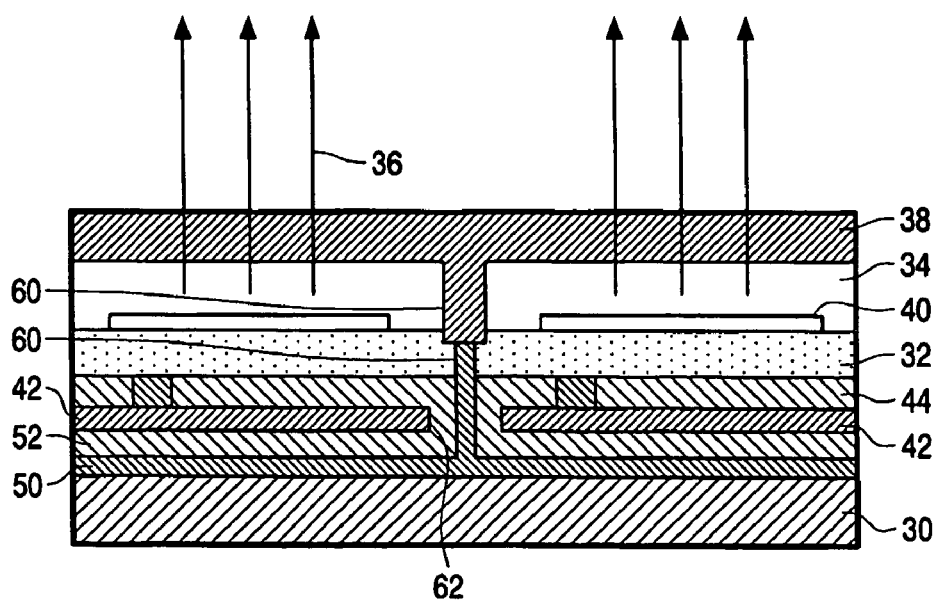
FIG. 6 shows a third example of display device according to the invention.

FIG. 6 shows a modification to the example of FIG. 5, and the same reference numerals are again used for the same components. A second metal layer 50 is provided between the substrate 30 and the active matrix layer 32, isolated from the first metal layer 42 (which is the power supply line). The second metal layer 50 is connected to the ITO common potential line 38 overlying the EL material layer 34. In this way, the ITO common potential line is connected at each pixel location (or at least at regular intervals) to a metal sheet layer. The power supply line is also formed by a metal conductor 42 as in the example of FIG. 5.

The second metal layer 50 is provided over the substrate 30 and a first insulator layer 52 overlies the second metal layer 50. The metal sheet 42 of the power supply line 26 overlies the first insulator layer 52. A second insulating layer 44 (corresponding to the insulating layer 44 in FIG. 5) is provided between the metal sheet 42 and the active matrix circuitry 32, with the contact portions 46 through the second insulating layer 44.

The connections between the second metal layer 50 and the ITO common potential line 38 comprise contacts 60 extending through openings 62 in the metal sheet 42 and through the active matrix circuitry 32. The two metal sheets 42,50 should be as thick as possible and of as low resistivity metal as possible. The dielectric spacers (the insulating layers) are high integrity material. The contacts 60 may be metal only with a patterned contact pad beneath or above the ITO layer 38, as it is easier to pattern these contacts from metal rather than from ITO.

In the examples above, the light emitting display elements have opaque cathodes, and the light emission is from the anode side of the display element.

Figure 7:
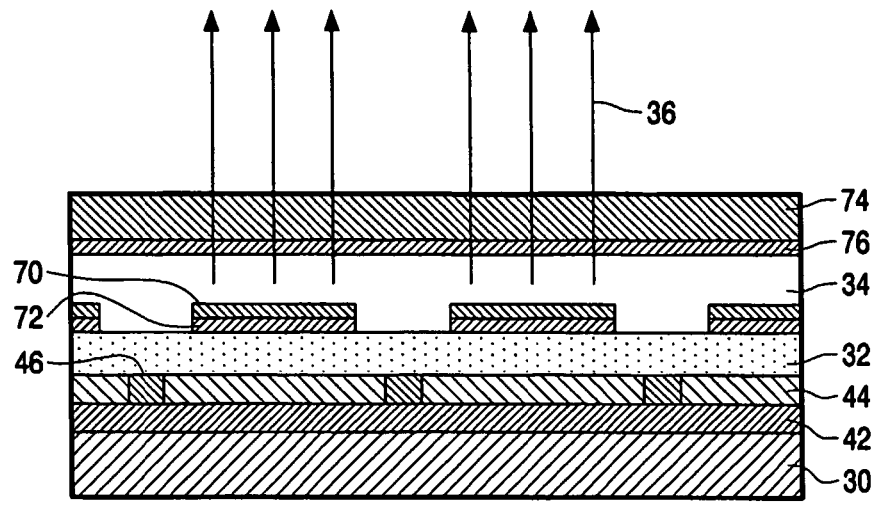
FIG. 7 shows a fourth example of display device according to the invention.

There are also pixel designs which enable transparent (or at least semi-transparent) cathodes to be formed. This then enables an upward emitting structure to be formed while still avoiding patterning of the cathode. FIG. 7 shows one application of the invention to this type of pixel design.

In FIG. 7, the same reference numerals are used as in FIG. 5 to denote the same components. The anode overlies the active matrix substrate, and is again formed from an ITO pixel electrode 70. ITO is still used as the anode material even though there is no need for the anode to be transparent, because ITO has the required electronic properties (in particular for the injection of holes) as well as deposition properties. A metal pixel electrode 72 lies beneath the ITO layer 70 and acts as a reflector so that (substantially) all light emission is upwardly, away from the substrate.

The cathode is formed from an ITO support 74 beneath which a thin layer 76 of the desired cathode material is formed. Again, this cathode material includes a low work function metal such as calcium or barium. However, the thickness is reduced to a level where the cathode is at least partially transparent, for example 50% transparent. Patterning of the cathode material is still avoided.

Figure 8:
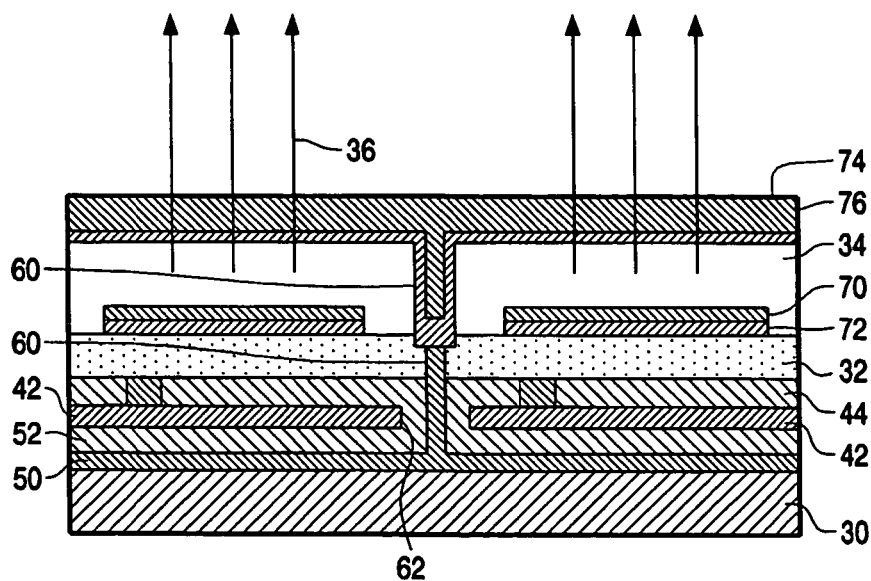
FIG. 8 shows a fifth example of display device according to the invention.

The example of FIG. 6, in which the resistance of the transparent top electrode is reduced, can also be modified to use a transparent cathode variation, as shown in FIG. 8.

In FIG. 8, the same reference numerals are used as in FIGS. 6 and 7 to denote the same components.

The anode again overlies the active matrix substrate, and again has an ITO part 70 and a metal part 72. The cathode is again formed from an ITO support 74 and a thin layer 76 of the desired cathode material is formed.

There will be a number of possible materials for the conducting layer used to implement the invention. Where it is required to be transparent, ITO is an obvious candidate. Other transparent conductive layers have however been proposed. Where it can be opaque, the layer may be any suitable metal layer, which may be formed as a foil or may be deposited by more conventional techniques.

The specific choice of materials to be used within the device structure has not been discussed in detail in this application, as the implementation of the invention will be routine for those skilled in the art. Indeed, the layers used conventionally in the manufacture of EL display devices can be employed, and the invention essentially requires row conductors to be replaced by a continuous layer (possibly with vias) and with interconnections provided to individual pixels. The detailed processing steps will not therefore be discussed in detail.

Difficulties may arise in stepping the ITO layer 38 of FIG. 6 through deep contact vias to the underlying metal. A strap contact may be used in this example, namely an additional metal layer above the ITO which passes through the via to the underlying metal electrode. The strap metal may be in contact with the ITO or separated from it by an insulator.

In the upward emitting examples of FIGS. 5 to 8, the substrate 30 may be a metal substrate which can then additionally function as one of the sheet metal contacts (for example avoiding the need for additional layers to define the contacts 42 or 50.

Various other modifications will be apparent to those skilled in the art.

The invention claimed is:

1. An active matrix electroluminescent display device comprising an array of display pixels, each pixel comprising: an electroluminescent display element; and active matrix circuitry including a drive transistor for driving a current through the display element, wherein the drive transistor and the display element are connected in series between a power line for supplying or drawing a controllable current to or from the display element and a common potential line, and wherein the power line and the common potential line each comprise a sheet electrode shared between all pixels of the array.

2. The device of claim 1, including a substrate, the active matrix circuitry overlying the substrate and an electroluminescent layer overlying the active matrix circuitry.

3. The device of claim 2, wherein the display is backward emitting through the substrate, and wherein the power line includes a substantially transparent electrically conductive sheet between the substrate and the active matrix circuitry.

4. The device of claim 3, wherein an insulating layer is provided between the substantially transparent electrically conductive sheet and the active matrix circuitry, contact portions being provided through the insulating layer.

5. The device of claim 2, wherein the display is upward emitting away from the substrate.

6. The device of claim 5, wherein the power line includes a metal sheet between the substrate and the active matrix circuitry.

7. The device of claim 6, including a second metal layer between the substrate and the active matrix layer, isolated from the metal sheet, and wherein the second metal layer is connected to the common potential line.

8. The device of claim 7, wherein the common potential line includes a substantially transparent electrically conductive layer forming anodes of the electroluminescent display elements, and overlying the electroluminescent layer, and wherein the second metal layer contacts the common potential line with contact portions extending through the active matrix circuitry.

9. The device of claim 7, wherein the common potential line includes a substantially transparent electrically conductive layer and a metal layer forming cathodes of the electroluminescent display elements, and overlying the electroluminescent layer, and wherein the second metal layer contacts the common potential line with contact portions extending through the active matrix circuitry.

10. The device of claim 8 or 9, wherein the second metal layer overlies the substrate, a first insulator layer overlies the second metal layer, and the metal sheet overlies the first insulator layer.

11. The device of claim 10, wherein a second insulating layer is provided between the metal sheet and the active matrix circuitry, contact portions being provided through the second insulating layer.

12. The device of claim 10, wherein contact portions that connect the second metal layer to the common potential line extend through openings in the metal sheet.

13. The device of claim 6, wherein the common potential line includes an ITO layer forming anodes of the electroluminescent display elements, and overlying the electroluminescent layer.

14. The device of claim 13, wherein an insulating layer is provided between the metal sheet and the active matrix circuitry, contact portions being provided through the insulating layer.

15. The device of claim 5, wherein the substrate includes a metal sheet that forms the power line.

16. The device of claim 5, 6, 7 or 9, wherein anodes of the electroluminescent display elements are adjacent the substrate and light emission is through cathodes of the electroluminescent display elements.

17. The device of claim 16, wherein the cathodes form the common potential line.

18. The device of claim 16, wherein the cathode includes a substantially optically transparent conducting layer of a first thickness, and a second layer of a second, smaller thickness, that includes a low work function metal.

19. The device of claim 1, wherein the active matrix circuitry includes, for each pixel, an address transistor connected between a data signal line and an input to the pixel.

20. The device of claim 19, wherein the active matrix circuitry includes, for each pixel, a storage capacitor connected between the power line and a gate of the drive transistor.

21. The device of claim 11, wherein contact portions that connect the second metal layer to the common potential line extend through openings in the metal sheet.

22. The device of claim 17, wherein the cathode includes a substantially optically transparent conducting layer of a first thickness, and a second layer of a second smaller thickness that includes a low work function metal.

* * * * *